Oct. 9, 1956

E. LIDOW

PHOTOCELL

Filed Oct. 31, 1955

2,766,144

INVENTOR.
ERIC LIDOW

BY

D. Gordon Angus
ATTORNEY.

United States Patent Office 2,766,144

Patented Oct. 9, 1956

2,766,144

PHOTOCELL

Eric Lidow, Los Angeles, Calif.

Application October 31, 1955, Serial No. 543,794

6 Claims. (Cl. 117—200)

This invention relates to photocells, and more particularly to photocells comprising a semi-conductor metal of the type which may possess P or N properties, particularly germanium and silicon.

This invention is a continuation in part of my co-pending patent application, Serial Number 468,865 filed November 15, 1954, now abandoned, entitled "Germanium Photocells."

It has hitherto been known that the junction between certain semi-conducting metals, and some other metals exhibits photo-sensitive as well as rectifying properties. Well known examples of such semi-conducting metals are germanium and silicon, which also can possess P or N properties. For example, a wafer of germanium has been fused to a crystal of indium to form a rectifying, photosensitive junction therebetween. The disadvantage of this junction is that substantially all of its area is surrounded by the opaque germanium and indium. Because light cannot penetrate the germanium disc and indium crystal, the junction is useless as a photocell. The only part of the junction which is exposed to the light is the thin edge thereof at the surface of the crystal structure. This thin line-edge is too small to furnish a quantitatively sufficient photosensitive effect.

It is an object of this invention to provide photocells which can use elemental germanium or silicon and in which a substantial area of the photosensitive junction of the germanium or silicon is available to provide a photosensitive effect.

A related object is to make useful some portions of the interface which are not disposed directly on the surface of the photocell structure.

The invention is carried out by providing a piece of semi-conductor metal, such as germanium or silicon for example, with a coating on each of a pair of its surfaces. One of the coatings is electrically conductive, and the other is not only conductive but also translucent. Thus two coatings or layers are spaced from and out of contact with each other. The translucent coating is made of a conductive metal which has the property of creating a photosensitive interface (sometimes called a junction) with the semi-conductor. This translucent coating is deposited so thinly that light can penetrate through it to strike the semi-conductor which the translucent coating covers. This translucent coating thereby permits substantially the entire interface between itself and the semi-conductor to be effective in providing a photosensitive effect, since light can penetrate through the translucent coating to all regions of the interface.

A feature resides in the use of an N-type semi-conductor wafer with a translucent coating of a group III element of the periodic system of elements, or of P-type semi-conductor with a translucent coating of a group V element of the periodic system of elements.

A related, but optional feature resides in alloying certain metals of group III with certain metals of group IV to improve the conductivity of the translucent coating, and, if desired, to provide a light-filtering effect.

The above and other features of the invention will be fully understood from the following detailed description and the accompanying drawings, of which:

Figure 1:
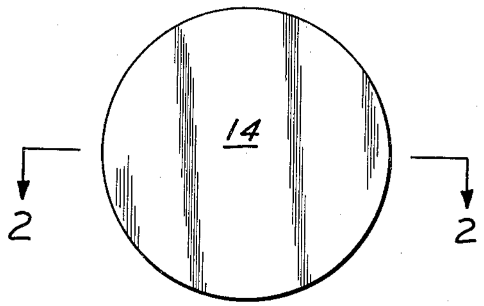
Fig. 1 is a plan view of a photocell according to the invention.
Figure 2:
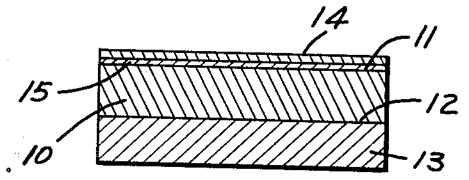
Fig. 2 is a cross-section taken at line 2—2 of Fig. 1.

A photocell constructed according to this invention has a central slice or wafer of semi-conductor metal 10. Surfaces 11, 12, which may be planar if desired, are formed on opposite sides of the wafer from a bar of semi-conductor metal. A conductive coating 13 of any suitable metal is deposited on surface 12. This coating may be copper, for example, which can be applied by means such as electroplating.

On the surface 11 there is deposited a translucent conductive coating 14. The metal for this translucent coating is selected for having the property of providing a photosensitive effect at its interface 15 with semi-conductor metal. This coating 14 may be applied to the semi-conductor in any desired manner. Coatings 13 and 14 are spaced from each other, and do not contact each other.

This translucent coating will preferably be only of the order of a few Angstroms in thickness. Such thinness is essential if the coating is to be translucent and permit the passage of light to the semi-conductor. Coatings much thicker than this may tend to exclude the light from the interface. For depositing very thin coatings, a cathode sputtering technique is advantageous. An extremely thin coating can readily be applied to a surface by sputtering. It will be understood that there are other ways to apply this thin coating such as by a low voltage arc, or by evaporation. The technique of applying this translucent coating 14 is no limitation on the invention.

While the interface 15 is shown in the drawings as having an appreciable thickness, it will be understood that this is for the purpose of illustration. The nature of the interface between semi-conductor metals and other metals is not uniformly agreed upon by those skilled in the art; but in any event it is of extreme thinness, if, indeed, it can properly be considered a separate layer at all. Likewise the translucent coating 14 has been shown disproportionately thick relative to the semi-conductor wafer, this coating being only a few Angstroms thick. The thickness of the coating 13 is not particularly critical so long as it does not unduly increase the resistance of the photocell.

The semi-conductor metals suitable for this invention are those which can possess the well-known P and N properties. The metal may be selected, then, from the group consisting of silicon and germanium. Throughout this specification, where the term "semi-conductor" has been used, either silicon or germanium may be used, as desired.

It has been found that there is wide range of metals suitable for the translucent coating 14. Broadly speaking, the preferred combinations of types of semi-conductor and of coating metals are as follows:

1. N-type semi-conductor with a translucent coating of a group III element.

2. P-type semi-conductor with a translucent coating of a group V element.

While the combinations of the various group III and group V elements disclosed above are all useful, some are more easily adapted to this invention than others. For example, with N-type semi-conductor, a preferred coating metal is indium. Indium can easily be sputtered and a very thin coating can be readily obtained. For the same reason, antimony and bismuth are preferred group V metals for use with P-type semi-conductor metal, since they are also easily sputtered.

It has also been found that alloys of group III and some group IV metals will provide a good coating for P-type semi-conductor metal. Also, metals selected from the group consisting of gold, silver or platinum can be alloyed with any desired group III metal so as to create a coating of higher electrical conductivity than is obtainable with a grup V element alone. Some of these alloying metals also provide a light-filtering action as well. This alloy does not appreciably reduce the translucency of the metal coating, but it does increase the conductivity.

Other means will readily suggest themselves to a person skilled in the art for making a photocell according to this invention. For example, it is possible to begin with a metal base plate, which may be aluminum or tinned copper, for example, and which corresponds with the layer 13 shown in the drawings. Then the semi-conductor metal may be applied by some means, sputtering being one example, until a layer of the desired thickness is built up. The translucent coating may be applied as described above in order to complete the photocell.

The spirit of this invention resides in the semi-conductor metal interface in which the interface 15 itself is exposed to light which passes through the thin translucent coating. By means of this construction, the full area of the interface between the semi-conductor wafer and the translucent coating is exposed to light and can produce a photosensitive effect. Thus, an appreciable extent of the surface area of interface is active, and a desirable photocell results.

Numerous modifications, particularly in the manner of creating the various layers of the photocell will be evident to those persons skilled in the art. Furthermore, the terms "wafer" and "disk" as used herein will be understood to include the term "layer." Therefore this invention is not to be limited by the embodiments shown in the drawings and described in the description, which are given by way of example and not of limitation, but only in accordance with the scope of the appended claims.

I claim:

1. A photocell comprising a wafer of a semi-conductor metal selected from the group consisting of N-type germanium and N-type silicon, having surfaces thereon, a conductive coating on one of said surfaces, and a conductive translucent coating on another of said surfaces, said coatings being spaced from and out of contact with each other, said translucent coating being made of a metal of group III of the periodic system of elements, which, when in contact with germanium metal forms an interface which possesses photosensitive properties, the translucent coating being of the order of a few Angstroms in thickness in order to permit of translucency therethrough.

2. A photocell comprising a wafer of a semi-conductor metal selected from the group consisting of P-type germanium and P-type silicon, having surfaces thereon, a conductive coating on one of said surfaces, and a conductive translucent coating on another of said surfaces, said coatings being spaced from and out of contact with each other, said translucent coating being made of a metal of group V of the periodic system of elements, which, when in contact with germanium metal forms an interface which possesses photosensitive properties, the translucent coating being of the order of a few Angstroms in thickness in order to permit of translucentcy therethrough.

3. A photocell comprising a wafer of a semi-conductor metal selected from the group consisting of P-type germanium and P-type silicon, said wafer having surfaces thereon, a conductive coating on one of said surfaces, and a conductive translucent coating on another of said surfaces, said coatings being spaced and out of contact with each other, said translucent coating being made of an alloy of a group III and a group IV metal of the periodic system of elements, which translucent coating, when in contact with the semi-conductor metal forms an interface which possesses photosensitive properties, the translucent coating being of the order of a few Angstroms in thickness in order to permit of translucency therethrough, whereby the conductivity of the translucent coating is increased over that obtainable with a translucent coating of a group V element of equal thickness.

4. In combination, a wafer of a semi-conductor metal selected from the group consisting of N-type germanium and N-type silicon, said wafer having a conductive coating on a surface thereon, and a translucent coating on said wafer, said translucent coating being spaced from and out of contact with said conductive coating, said translucent coating being made of a metal which, when in contact with the semi-conductor metal forms an interface which possesses photosensitive properties, the translucent coating being of the order of a few Angstroms in thickness in order to permit of translucency therethrough, which metal of the translucent coating is opaque in appreciable thickness, and the metal of the translucent coating being selected from the metals of group III of the period system of elements.

5. In a photocell having a wafer of a semi-conductor metal selected from the group consisting of P-type germanium and of P-type silicon, said wafer having a conductive coating on the surface thereof, a translucent coating on said wafer, said translucent coating being spaced from and out of contact with said conductive coating, said translucent coating being made of a metal which, when in contact with the semi-conductor metal, forms an interface which possesses photosensitive properties, the translucent coating being of the order of a few Angstroms in thickness in order to permit of translucency therethrough, which metal of the translucent coating is opaque in appreciable thickness, and the metal for the translucent coating being selected from the metal of group V of the periodic system of elements.

6. In a photocell having a wafer of a semi-conductor metal selected from the group consisting of N-type germanium and N-type silicon, said wafer having a conductive coating on the surface thereon, a translucent coating on said wafer, said translucent coating being spaced and out of contact with said conductive coating, said translucent coating being made of a metal which, when in contact with the semi-conductor metal forms an interface which possesses photosensitive properties, the translucent coating being of the order of a few Angstroms in thickness in order to permit of translucency therethrough, which metal of said coating is opaque in appreciable thickness, and the metal for the translucent coating being an alloy of at least one metal of group III of the periodic system of elements, and at least one metal selected from the group consisting of gold, silver and platinum.

References Cited in the file of this patent

UNITED STATES PATENTS

| | | |
|---|---|---|
| 2,622,117 | Benzer | Dec. 16, 1952 |
| 2,650,311 | Bray | Aug. 25, 1953 |
| 2,667,607 | Robinson | Jan. 26, 1954 |